United States Patent [19]

Myrick

[11] Patent Number: 5,629,532
[45] Date of Patent: May 13, 1997

[54] DIAMOND-LIKE CARBON OPTICAL WAVEGUIDE

[76] Inventor: James J. Myrick, 748 Greenwood, Glencoe, Ill. 60022

[21] Appl. No.: 473,245

[22] Filed: Jun. 7, 1995

Related U.S. Application Data

[62] Division of Ser. No. 372,864, Jan. 13, 1995, Pat. No. 5,514,885, which is a continuation of Ser. No. 232,869, Apr. 25, 1994, abandoned, which is a continuation of Ser. No. 141,896, Oct. 22, 1993, abandoned, which is a continuation of Ser. No. 33,057, Mar. 10, 1993, abandoned, which is a continuation of Ser. No. 939,952, Sep. 3, 1992, abandoned, which is a continuation of Ser. No. 697,941, May 9, 1991, abandoned, which is a continuation of Ser. No. 566,879, Aug. 14, 1990, abandoned, which is a continuation of Ser. No. 206,483, Jun. 13, 1988, abandoned, which is a continuation-in-part of Ser. No. 916,817, Oct. 9, 1986, Pat. No. 4,751,193.

[51] Int. Cl.$^6$ .................... H01L 31/0312; H01L 31/0232
[52] U.S. Cl. .................... 257/77; 257/436; 385/130; 385/132; 385/142; 385/144
[58] Field of Search .................... 257/77, 98, 436; 385/123, 130, 132, 142, 144

[56] References Cited

U.S. PATENT DOCUMENTS

| | | | |
|---|---|---|---|
| 3,383,298 | 5/1968 | Wilson et al. | 204/155 |
| 4,328,646 | 5/1982 | Kaganowicz | 51/281 R |
| 4,350,537 | 9/1982 | Young et al. | 148/1.5 |
| 4,356,384 | 10/1982 | Gat | 219/347 |
| 4,461,670 | 7/1984 | Celler et al. | 156/603 |
| 4,482,393 | 11/1984 | Nishiyama et al. | 148/1.5 |
| 4,564,403 | 1/1986 | Hayafuji et al. | 148/171 |
| 4,662,949 | 5/1987 | Inoue et al. | 148/1.5 |
| 4,673,475 | 6/1987 | Windischmann | 204/192.11 |
| 4,704,186 | 11/1987 | Jastrzebski | 156/612 |
| 4,751,193 | 6/1988 | Myrick | 437/19 |

FOREIGN PATENT DOCUMENTS

| | | |
|---|---|---|
| 221207A | 4/1985 | Germany. |
| 58-33832A | 2/1983 | Japan. |

OTHER PUBLICATIONS

Yukio Saito, Shinpe Matsuda, Shunsuke Nogita, "Synthesis of Diamond by Decomposition of Methane in Microwave Plasma," *Journal of Materials Science Letters* 5, (1986); pp. 565–568.

Michael J. Mirtich, et al., "Dual Ion Beam Deposition of Carbon Films With Diamondlike Properties," *NASA Technical Memorandum* 83743, (prepared for the Eleventh International Conference on Metallurgical Coatings sponsored by the American Vacuum Society, San Diego, California, Apr. 9–13, 1984); 18 pages.

Joseph Zelez, "A Diamond–Like Carbon Film," *RCA Review*, vol. 43, (Dec. 1982); p. 665 (Abstract Only).

"Scientific Discover Diamond–Film Coating Process," *New York Times News Service*, date and page unknown.

L. M. Brown, "Dawn of the Diamond Chip," *Nature*, vol. 350, (18 Apr., 1991); pp. 561–562.

John G. Posa, "Gallium Arsenide on Silicon: The Growth of Something Big," *Semiconductor International*, (Mar., 1987); p. 36.

S. Prawer, R. Kalish, M. Adel & V. Ritcher, "Effects of Heavy Ion Irradiation on Amorphous Hydrogenated (Diamondlike) Carbon Films," *J. Appl. Phys.* 61 (9), (May 1, 1987), American Institute of Physics; pp. 4492–4500.

(List continued on next page.)

*Primary Examiner*—Ngân V. Ngô
*Attorney, Agent, or Firm*—Fitch, Even, Tabin & Flannery

[57] ABSTRACT

An optical circuit device has a carbon optical waveguide structure which has a substrate. A first carbon layer is atop the substrate and has a first refractive index. A carbon optical waveguide core is positioned atop the first layer and has a second refractive index different than the first refractive index. A cladding layer of carbon is positioned atop the first layer and the waveguide core and has a third refractive index different than the refractive index of the waveguide core.

1 Claim, 8 Drawing Sheets

OTHER PUBLICATIONS

S. T. Amimoto, J. S. Whittier, A. Whittaker, A. Chase, R. Hofland, Jr., The Aerospace Corporation and M. Bass USC Center for Laser Studies, "Pulsed $D_2$–$F_2$ Chain–Laser Damage to Coated Window and Mirror Components," *Source Unknown*, (date unknown); pp. 387–396.

G. K. Celler, "Silicon–on–Insulator Films by Oxygen Implantation and Lamp Annealing," *Solid State Technology*, (Mar., 1987); pp. 93–98.

"RTP: On the Edge of Acceptance," *Semiconductor International*, Edited by Sandra Leavitt, (Mar., 1987); 7 pages ending with p. 70.

K. Tsutsui, T. Asano, H. Ishiwara and S. Furukawa, "GaAs–MESFETS Fabricated in SOI Layers on Crystalline $Ca_x Sr_{1-x} F2$ Insulator Films," 32.3 (1986) *IEEE*; pp. IEDM 86–755–758.

John G. Posa, "Uniting Silicon and Gallium Arsenide," *High Technology*, (Mar., 1967); pp. 38–41.

Tom Johnson, "Flashblast–The Light That Cleans," *Popular Science*, (Jul., 1982); pp. 82–84.

Ken–ichi Kondo and Thomas J. Ahrens, "Shock Compression of Diamond Crystal," *Geophysical Research Letters*, vol. 10, No. 4, (Apr., 1983); pp. 281–284.

John S. Dickey, Jr., William A. Bassett, John M. Bird and Maura S. Weathers, "Liquid Carbon in the Lower Mantle?," *Geology*, vol. 11; (Apr., 1983); pp. 219–220.

Francis P. Bundy, "The P, T Phase and Reaction Diagram for Elemental Carbon, 1979," *Journal of Geophysical Research*, vol. 85, No. B12, (Dec. 10, 1980); pp. 6930–6936.

A. Greenville Whittaker, Ethel J. Watts, Roy S. Lewis and Edward Anders, "Carbynes: Carriers of Primordial Noble Gases in Meteorites," *Science*, Reports, vol. 209 (26 Sep., 1980); pp. 1512–1514.

Adrian Webster, "Carbyne as a Possible Constituent of the Interstellar Dust," *Mon. Not. R. Astr. Soc.*, Short Communication (Received Mar. 7, 1980); pp. 7P–9P.

Ryoichi Hayatsu, Robert G. Scott, Martin H. Studier, Roy S. Lewis and Edward Anders, "Carbynes in Meteorites: Detection, Low–Temperature Origin and Implications for Interstellar Molecules," *Science*, vol. 209 (Sep. 26, 1980), pp. 1515–1518.

A. Greenville Whittaker, "Carbon: A New View of its High–Temperature Behavior," *Science*, vol. 200; (May 19, 1978); pp. 763–764.

Seiichiro Matsumoto, "Chemical Vapour Deposition of Diamond in RF Glow Discharge," *Journal of Materials Science Letters* 4; (1985); pp. 600–602.

Celler, et al., "Seeded Oscillatory Growth of Si Over SiO2 by Laser Irradiation," *Appl. Phys. Lett.* 40(12), pp. 1043–1045 (Jun. 15, 1982).

Colinge, et al., "Use of Selective Annealing for Growing Very Large Grain Silicon on Insulator Films," *Appl. Phys. Lett.* 41(4); pp. 346–347 (Aug. 15, 1982).

Colinge, et al., "Transistors Made in Single–Crystal SOI Films," *IEEE Electron Device Letters*, vol. EDL–4, No. 4; pp. 74–77; (Apr., 1983).

Kyung, "Temperature Profile of a Silicon–on–Insulator Multilayer Structure in Silicon Recrystallization With Incoherent Light Source," *IEEE Transactions on Electron Devices*, vol. ED–31, No. 12, pp. 1845–1851; (Dec., 1984).

Fischer, et al., "Prospects for the Monolithic Integration of GaAs and Si," *IEEE GaAs IC Symposium*, pp. 71–73; (1985).

Fischer, et al., "GaAs Biopolar Transistors Grown on (100) Si Substrates by Molecular Beam Expitaxy," *Appl. Phys. Lett.* 47(4); pp. 397–399 (Aug. 15, 1985).

Fischer, et al., "Disclocation Reduction in Expitaxial GaAs on SI (100)," *Appl. Phys. Lett.* 45(18), pp. 1223–1225; (May 5, 1986).

H. J. Leamy, et al., "Laser Fabrication of Silicon on Dielectric Substrates," *Proceedings of the Materials Research Society Annual Meeting*, Boston, Mass., Nov. 16–19, 1981, North Holland, Amsterdam, Netherlands, pp. 459–504; (1982).

T. Stultz, et al., "Beam Processing of Silicon with a Scanning CW Hg Lamp," *Mat. Res. Soc. Symp. Proc.*, vol. 13, pp. 463–476; (1983).

D. Bensahel, et al., "Localization of Defects on SOI Films via Selective Recrystallization Using Halogen Lamps," *Electron Lett.*, vol. 19, No. 13, pp. 464–466, (Jun. 23, 1983).

T. Xingli, et al., "A High Power Vortex Gas Flow Stabilized Flashlamp," *Chin. Phys.*, vol. 4, No. 1, pp. 131–136, (Jan.–Mar., 1984).

G. Bagnasco, et al., "Two Frequency Self–Injected Flashlamp Pumped Dye Laser for Non–Linear Optics Experiments," *IEEE J. Quantum Electron*, vol. QE–19, No. 2, pp. 202–208, (Feb., 1983).

T. Yunglu, "Generation of UV Picosecond High Power Laser Pulses for Laser–Produced Plasma Diagnosis," *Laser J.*, vol. 9, No. 10, pp. 625–628, (Oct. 20, 1982).

J. Jethwa, et al., "A Reliable High Average Power Dye Laser," *1977 IEEE/OSA Conference on Laser Engineering and Applications*, Jun. 1–3, 1977, vol. QE–13, No. 9, pp. 29–30, (Sep., 1977).

F. Kazutaka, et al., "Properties of Carbon Films by DC Plasma Deposition," *Appl. Phys. Lett.*, 47(4), (Aug. 15, 1985).

L. Holland, et al., "The Growth of Carbon Films With Random Atomic Structure From Ion Impact Damage in a Hydrocarbon Plasma," *Thin Solid Films*, 58, pp. 107–116 (1979).

H. Vora, et al., "Structural Investigation of Thin Films of Diamondlike Carbon," *J. Appl. Phys.*, 52(10) pp. 6151–6157 (Oct., 1981).

S. Berg, et al., "Diamond–Like Carbon Films Produced in a Butane Plasma," *Thin Solid Films*, 58, pp. 117–120 (1979).

T. J. Moravec, et al., "Electron Spectroscopy of Ion Beam and Hydrocarbon Plasma Generated Diamondlike Carbon Films," *J. Vac. Sci. Technol.*, 18(2), pp. 226–228.

S. Matsumoto et al., "Vapor Deposition of Diamond Particles from Methane," *Jpn J. Appl. Phys.*, vol. 21, No. 4, pp. L183–L185, (Apr., 1982).

B. V. Spitsyn, et al., "Vapor Growth of Diamond on Diamond and Other Surfaces," *J. Cryst. Growth*, 52, pp. 219–226 (1981).

D. S. Whitmell, et al., "The Deposition of Hard Surface Layers by Hydrocarbon Cracking in a Glow Discharge," *Thin Solid Films*, 35, pp. 255–261, (1976).

S. Aisenberg, et al., "Ion–Beam Deposition of Thin Films of Diamondlike Carbon," *J. Appl. Phys.*, vol. 42, No. 7, pp. 2953–2958, (Jun., 1971).

E. G. Spencer, et al., "Ion–Beam Deposited Polycrystalline Diamondlike Films," *Appl. Phys. Lett.*, vol. 29,, No. 2, pp. 118–120, (Jul. 15, 1976).

M. Maeda, et al., "Amplification of UV Picosecond Pulses by Excimer Lasers," *Oyo Buturi*, vol. 49, No. 11, pp. 1107–1116, (Nov., 1980).

S. Craig, et al., "Structure, Optical Properties and Decomposition Kinetics of Sputtered Hydrogenated Carbon," *Thin Solid Films,* 97, pp. 345–361 (1982).

A. Hiraki, et al., "Tetrahedral Carbon Film by Hydrogen Gas Reactive RF–Sputtering of Graphite Onto Low Temperature Substrate," *Solid State Commun.,* vol. 50, No. 8, pp. 713–716 (1984).

Dutarte, "In Situ Observation of Lamp Zone Melting of Si Films on Patterned $SiO_2$," *Appl. Phys. Letts.,* 48(5), pp. 350–352, (Feb. 3, 1986).

Downer, et al., "Ultrafast Heating of Silicon on Sapphire by Femtosecond Optical Pulses," *Phys. Rev. Letts.,* vol. 56, No. 7, pp. 761–764 (Feb. 17, 1986).

Seidel, et al., "Temperature Transients in Heavily Doped and Undoped Silicon Using Rapid Thermal Annealing," *J. Appl. Phys.,* 57(4), pp. 1317–1321 (Feb. 15, 1985).

Scharff, et al., "Flash–Lamp–Induced Crystal Growth of Silicon on Amorphous Substrates Using Artificial Surface–Relief Structures," *Phys. Stat. Sol.,* vol. 74A, pp. 454–552 (Dec., 1982).

Robinson, et al., "Comparison of Thin Film Transistor and SOI Technologies," *Materials Research Society Symposia,* vol. 33, pp. 71–80, ed. Lam et al., (Feb., 1984)

Usami, et al., "Flash–Lamp Annealing of Ion–Implanted Silicon and its Application to Solar Cells," *IEEE Electron Device Letters,* vol. EDL–4, No. 6, pp. 166–168, (Jun., 1983).

Cohen, et al., "Thermally Assisted Flash Annealing of Silicon and Germanium," *Appl. Phys. Letts.* 33(8), pp. 751–753 (Oct. 15, 1978).

Bomke, et al., "Annealing of Ion–Implanted Silicon by an Incoherent Light Pulse," *Appl. Phys. Letts.,* 33(11), pp. 955–957 (Dec. 1, 1978).

B. M. Carder, et al., "Applying a Compensated Pulsed Alternator to a Flashlamp Load for Nova," *Second IEEE International Pulsed Power Conference Digest of Technical Papers,* Lubbock, Texas, Jun. 12–14, 1979, IEEE, New York, pp. 459–462 (1979).

R. C. Knight, et al., "Efficient Burst–Mode Operation of a Very High Repetition Rate Nd: YAG Laser," *J. Phys. E.,* vol. 13, No. 12, pp. 1339–1342 (Dec., 1980).

DIAMOND-LIKE CARBON OPTICAL WAVEGUIDE

This application is a division of application Ser. No. 08/372,864, filed Jan. 13, 1995, now U.S. Pat. No. 5,514,885 which is a continuation application of Ser. No. 08/232,869, filed Apr. 25, 1994, now abandoned, which is a continuation application of Ser. No. 08/141,896, filed Oct. 22, 1993, now abandoned, which is a continuation application of Ser. No. 08/033,057, filed Mar. 10, 1993, now abandoned, which is a continuation application of Ser. No. 07/939,952, filed Sep. 3, 1992, now abandoned, which is a continuation application of Ser. No. 07/697,941, filed May 9, 1991, now abandoned which is a continuation application of Ser. No. 07/566,879, filed Aug. 14, 1990, now abandoned which is a continuation application of Ser. No. 07/206,483, filed Jun. 13, 1988, now abandoned, which is a continuation-in-part application of Ser. No. 06/916,817, filed Oct. 9, 1986, and issued as U.S. Pat. No. 4,751,193.

The present invention is also directed to methods and apparatus for manufacturing very hard, diamond-like surfaces and waveguides for integrated circuit, medical and aerospace applications.

BACKGROUND OF THE INVENTION

This invention relates to methods of manufacturing large crystalline and monocrystalline semiconductor-on-insulator, conductor-on-insulator and superconductor-on insulator composites, and integrated circuits utilizing such composites.

Large, high quality gallium arsenide and other III-V and II-VI semiconductor substrates for applications such as active and passive optical devices, microwave, millimeter wave devices, millimeter wave integrated circuits, and high speed digital signal processing applications, which have good mechanical strength and thermal properties are needed to realize the performance potential for such materials. However, the brittle nature, thermal volatility and susceptibility of such materials to processing damage from cutting, polishing or prolonged exposure to high temperature, as well as relatively high bulk defect densities, present significant limitations to development of technologies using such materials.

Because of the developed technology for manufacture and processing of large diameter monocrystalline silicon wafers, and the desirable mechanical and thermal properties of silicon, substantial effort has been directed to the development methods for epitaxial growth of GaAs on monocrystalline silicon wafers [e.g., Fischer, R., et al., "Prospects for the Monolithic Integration of GaAs and Si", IEEE Gallium Arsenide Integrated Circuit Symposium, Monterey, Calif., Nov. 12–14, 1985, IEEE, New York, USA, 210 pp. pp. 71–3, 1985; Fischer, R., et al., "GaAs Biopolar Transistors Grown on (100) Si Substrates by Molecular Beam Epitaxy", Appl. Phys. Lett. Vol. 47, No. 4, pp. 397–399,Aug. 15, 1985]. However, the large lattice mismatch produces a high density of dislocations which adversely affect the properties of the GaAs layer. This problem has been partially alleviated by the use of silicon wafer substrates which are precisely "tilted" at a small angle from the 100 crystalline surface. Such "tilting" of the silicon wafer substrate creates a series of "steps" at the GaAs-Si interface, creating edge dislocations with Burgers vectors parallel to the interface so that they do not propagate into the bulk epitaxial layer, which reduce the dislocation density [Fischer, R., et al., "Dislocation Reduction in Expitaxial GaAs on Si (100)", Appl. Phys. Lett., Vol. 48, No. 18, pp. 1223–1225, May 5, 1986]. The incorporation of an InGaAs/GaAs strained-layer superlattice in GaAs-on-silicon composites may also be used to significantly reduce the density of (e.g., threading) dislocations in thick GaAs layers above the strained layer superlattice [Fischer, R., et al., supra]. However, the growth of thick epitaxial layers of GaAs and strained-layer superlattice structures is expensive, time consuming and unsuited to high volume production. In addition, because the epitaxial GaAs layers are directly contiguous to the semiconductive silicon wafer substrate, circuit elements made from such wafers may have higher capacitance than desirable to fully utilize the potential speed of the GaAs layer, and may have undesirably low resistance to ionizing radiation.

There has also been substantial research effort directed to the growth of device-worthy silicon crystals on insulating substrates, to provide latch-up free integrated circuits having low sensitivity to ionizing radiation, low capacitance, and high packing density for very large scale IC's [Leamy, et al., "Laser Fabrication of Silicon on Dielectric Substrates" Proceedings of the Materials Research Society Annual Meeting, Boston, Mass., Nov. 16–19, 1981, North- Holland, Amsterdam, Netherlands, pp. 459–504, 1982]. Typically, polysilicon or amorphous silicon is recrystallized laterally on a layer of silicon dioxide through contact windows to the monocrystalline silicon wafer substrate. Such recrystallization has been accomplished by laser beam scanning to selectively melt and recrystallize the silicon surface layer, by the application of halogen lamps in a scanning arrangement to melt the silicon layer for recrystallization without melting the wafer substrate, or by programmed application of halogen lamps to the entire wafer over an extended time period to melt the surface while cooling the wafer substrate below the melting point of silicon. Very close control of the temperature profile is a crucial parameter in such processes. [See e.g., J. P. Colinge, et al., "Use of Selective Annealing for Growing Very Large Grain Silcon-On-Insulator", Applied Physics Letters, Vol. 41, No. 14, pp. 346–347, August, 1982; J. P. Colinge, et al., "Transistors Made in Single-Crystal SOI Films", IEEE Electron Device Letters, Vol. EDL-4, No. 4, April, 1983; G. K. Celler, et al., "Seeded Oscillatory Growth of Si over SiO2 by CW Laser Irradiation", Applied Physics Letters, Vol. 40, No. 12, June, 1983; CM. Kyung, "Temperature Profile of a Silicon-On-Insulator Multilayer Structure in Silicon Recrystallization with Incoherent Light Source", IEEE Trans. Electron Devices, Vol. ED-31, No. 12, pp. 1845–1851, Dec. 1984; T. Stultz, et al., "Beam Processing of Silicon with a Scanning CW Hg Lamp", Elsevier, N.Y., pp. d463–76, 1983; D. Bensahel, et al., "Localization of Defects on SOI Films via Selective Recrystallization Using Halogen Lamps", Electron Lett., Vol. 19, No. 13, pp. 464–466, Jun. 23, 1983; H. J. Leamy, et al., "Laser Fabrication of Silicon on Dielectric Substrates" Proceedings of the Materials Research Society Annual Meeting, Boston, Mass., Nov. 16–19, 1981, North-Holland, Amsterdam, Netherlands, pp. 459–504, 1982]. However, these techniques have various disadvantages in terms of cost, production capacity and/or device properties or quality. For example, laser scanning techniques are costly and present difficulty in obtaining high quality single crystal silicon near the edges of the beam. In addition, overlapped successive scans can destroy the single crystal produced by the earlier scans causing random nucleation in the overlap region. Scanning or relatively slow heating of the amorphous silicon layer by means of halogen lamps tends to cause warping of the wafers, induces stress and imperfections in the recrystallized materials and permits impurity diffusion.

Moreover, such techniques have not been successfully applied to GaAs on insulator wafer production to produce high quality III-V devices. The development of a potentially high volume, inexpensive method for the formation of large area monocrystalline GaAs wafers would meet a significant need for the realization of the high speed potential of III-V large scale integrated circuits. Such methods and devices which provide for waveguide optical coupling of active optical diode and laser circuit elements would also be desirable. Methods and apparatus for backside gettering of impurities, and for optically pattern-controlled application of pulsed optical energy would also be desirable.

Accordingly, it is an object of the present invention to provide improved methods for manufacturing monocrystalline seeded semiconductor-on-insulator devices and structures, as well as the devices and structures themselves. It is a further object to provide economical methods for producing highly crystalline semiconductor surfaces for large area use such as solar power cells. It is a further object to provide improved integrated circuit and other semiconductor electronic devices. These and other objects will be apparent from the following drawings and description.

DESCRIPTION OF THE INVENTION

By applying one or more intense flashes of incoherent light, in a time which is small (e.g., in the range of from about one nanosecond to about 10 milliseconds, such as from about 0.1 to about 5 milliseconds) in respect to thermal conduction through an insulator layer, of sufficient intensity to melt an amorphous silicon or polysilicon layer except at seed windows, precise recrystallization control may be obtained.

Figure 1:
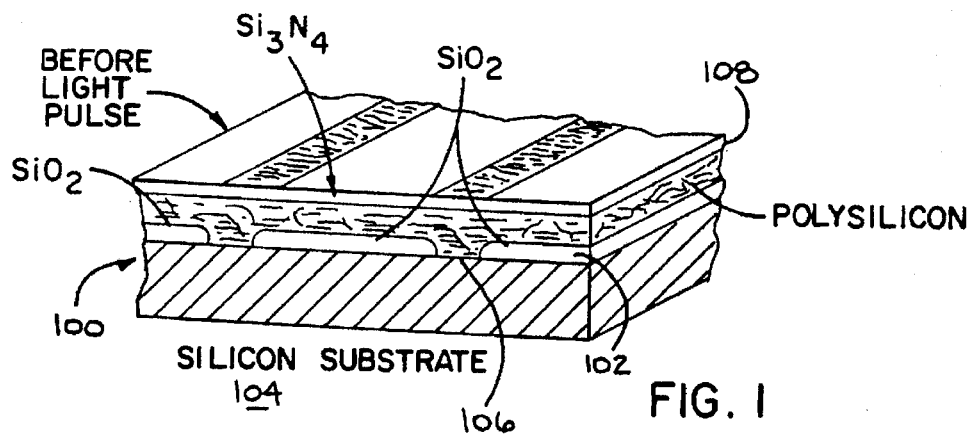
FIG. 1 is a cross sectional illustration of a layered semiconductor system during an intermediate processing step in accordance with an embodiment of a method in accordance with the present invention.

For example, as shown in FIG. 1, a thermal oxide layer 102 (e.g., in the range of from about 0.5 to about 2 microns thick) may be grown atop a standard, polished and etched bulk-silicon wafer (100) 104. Regularly patterned (e.g., square or linear) windows may be etched through the oxide, and polysilicon or amorphous silicon may be deposited on the wafer to a predetermined thickness of in the range of from about 1 to about 15 microns. The windows may be in the range of from about 1 to about 15 microns wide, and may be in the form of an array separated by from about 25 to about 80 micron distance in a (100) orientation along their length. A protective silicon nitride layer 108 may be provided over the amorphous or polysilicon layer to maintain the shape of the layer after it is melted, and during recrystallization. Furthermore, by encapsulating the patterned areas prior to the laser annealing step, the dimensional stability, surface texture and planarity of the discrete areas may be controlled. After patterning a suitable capping layer is deposited and, subsequent to crystallization, the capping layer is removed so that subsequent known processing steps may be implemented to form active devices on the array of single crystal islands. In this regard, silicon undergoes a significant (e.g., 20%) increase in volume upon crystallization, and would otherwise tend to "bead up" because of poor wetting properties on a silicon dioxide surface layer 102.

A spatially uniform (e.g., 5% power deviation over the surface to be melted) intense light pulse, which may be an incoherent flashlamp pulse is applied to melt the amorphous or polysilicon layer, so that a small portion of the monocrystalline substrate is also melted through the windows. The amount of power will depend on the substrate temperature, the polysilicon thickness and the environment temperature, and may readily be determined. The flashlamp may typically have a spectral emission characteristic similar to black body radiation at a temperature in the range of from about, say 7,000K. to about 9,500K.

High power flash lamps or pulsed free electron laser pulsed light systems may be provided in accordance with conventional practice, with particular attention to the design of light distribution or reflection systems which provide a substantially uniform energy distribution at the surface to be treated [e.g., T. Xingii; et al., "A High Power Vortex Gas Flow Stabilized Flashlamp", Chin. Phys., Vol. 4, No. 1, pp. 131–136, Jan–March 1984; G. Bagnasco, et al., "Two Frequency Self-Injected Flashlamp Pumped Dye Laser for Nonlinear Optics Experiments", IEEE J. Quantum Electron., Vol. QE-19, No. 2, pp. 202–208, Feb., 1983; T. Yunglu, "Generation of UV Picosecond High Power Laser Pulses for Laser-Produced Plasma Diagnosis", Laser J., Vol. 9, No. 10, pp. 625–628, Oct. 20, 1982; M. Maeda, et al., "Amplification of UV Picosecond Pulses by Excimer Lasers", Oyo Buturi, Vol. 49, No. 11, pp. 1107–1116, Nov. 1980; R. C. Knight, "Efficient Burst-Mode Operation of a Very High Repetition Rate Nd: YAG Laser", J. Phys. E., Vol. 13, No. 12, pp. 1339–1342, Dec. 1980; B. M. Carder, et al., "Applying a Compensated Pulse Alternator to a Flashlamp Load for Nova", 2nd IEEE International Pulsed Power Conference Digest of Papers, Lubbock, Tex. June 12–14, 1979, IEEE, N.Y., pp. 459–462, 1979; and J. Jethwa, et al., "A Reliable High Average Power Dye Laser", 1977] IEEE/OSA Conference on Laser Engineering and Applications, Jun. 1–3, 1977, Vol. QE-13, No. 9, pp. 29–30, Sept. 1977].

Desirably, the light pulse application will be carried out in an inert atmosphere, such as an argon atmosphere. The absorption characteristics of the "window" structure of the embodiment 100 are different from the "layer" structure. For example, approximately 35% of the incoming power absorbed in the "window" structure and 25% of the incoming power is absorbed in the layered structure [Transactions on Electron Devices, December, 1984, pp. 18–45 , 18–50] so that the heat energy deposited at the window structure may be significantly greater than that in the "layer" structure. By directing a spatially uniform light pulse to the polysilicon layer, it may be substantially instantaneously melted together with a small portion of the substrate at the "window". During processing, the entire wafer will desirably be maintained at an elevated temperature below the melting point of silicon (e.g., 1100°–1300 C.) such that cooling of the melted layer will be at a rate appropriate to crystallization in a monocrystalline manner from the window zones, across the top of the wafer. The nitride layer may be removed and the recrystallized layer may be etched, polished and processed to produce integrated circuits in accordance with conventional procedures. Imperfections are located at zones intermediate the "windows" and may be avoided in circuit design.

The high conductivity of molten silicon, together with the relatively low conductivity of the silicon dioxide layer, will provide a relatively uniform temperature to the molten silicon produced by the light pulse. However, over the crystallization window, which initially receives more input power, direct conduction to the bulk silicon will more rapidly reduce the temperature of the molten silicon layer to a crystallization temperature. Heat conduction from the monocrystalline zone will continue propagation of the monocrystalline layer.

One or more subsequent light pulses which are insufficient in energy to melt the top silicon layer, may be applied to maintain the appropriate monocrystallization fronts from the seed regions.

The present methods find particular utility in both the VLSI integrated circuit area, and in the solar cell industry.

Such SOI composite structures may be utilized in accordance with the present invention to provide latch-up free integrated circuits, particularly integrated digital memory and microprocessor circuits and integrated analog circuitry such as operational amplifier systems, which have low sensitivity to ion radiation and high packing density.

Figure 2:
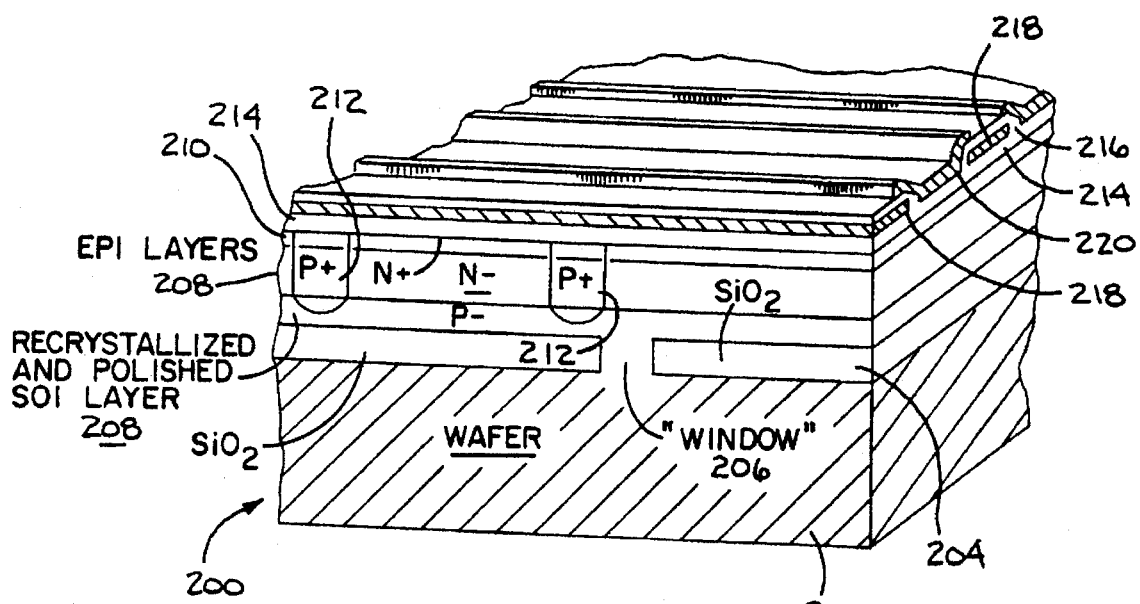
FIG. 2 is a cross sectional view of a charge coupled device manufactured from SOI wafer system produced with the present invention from a wafer system of the type illustrated in FIG. 1.

Such composites may also be used in the manufacture of circuits such as charge coupled devices which may also benefit from low capacitance effects. For example, illustrated in FIG. 2, is a charge coupled device (CCD) 200 which is fabricated from an SOI composite structure such as that produced form the layered structure of FIG. 1, following pulse recrystallization of the SOI layer. In this regard, the CCD 200 comprises a monocrystalline silicon [100] wafer 202 which may be a p-type wafer, upon which is formed an oxide dielectric layer 204 having windows 206 therein, as previously described. A p-type monocrystalline SOI layer 208 is formed by flashed light heating of a p– doped polycrystallaine silicon layer, as also previously described, followed by removal of the upper nitride layer, mechanical and chemical polishing to a thickness of from in the range of 0.5 to about 2 microns and monocrystalline epitaxial deposition (and implantation) of n-silicon layer 208 and n+ silicon layer in accordance with conventional manufacturing procedures for buried channel charge coupled devices.

A p+ diffusion step similarly provides CCD channel diffusion stop 212 parallel to the window strips 206 defining a CCD channel region therebetween in a region of monocrystalline silicon of high quality.

Dielectric layers 214, 216 and transfer electrodes 218, 220 may be provided, also in accordance with conventional practice. A suitable BCCD signal input structure such as an input diode, and a suitable BCCD output structure such as a sense diode or a distributed floating gate amplifier also provided in the channel in accordance with conventional practice. The device 200 has very low capacitance, which provides for high speed operation, and is relatively insensitive to ionize radiation.

Figure 3:
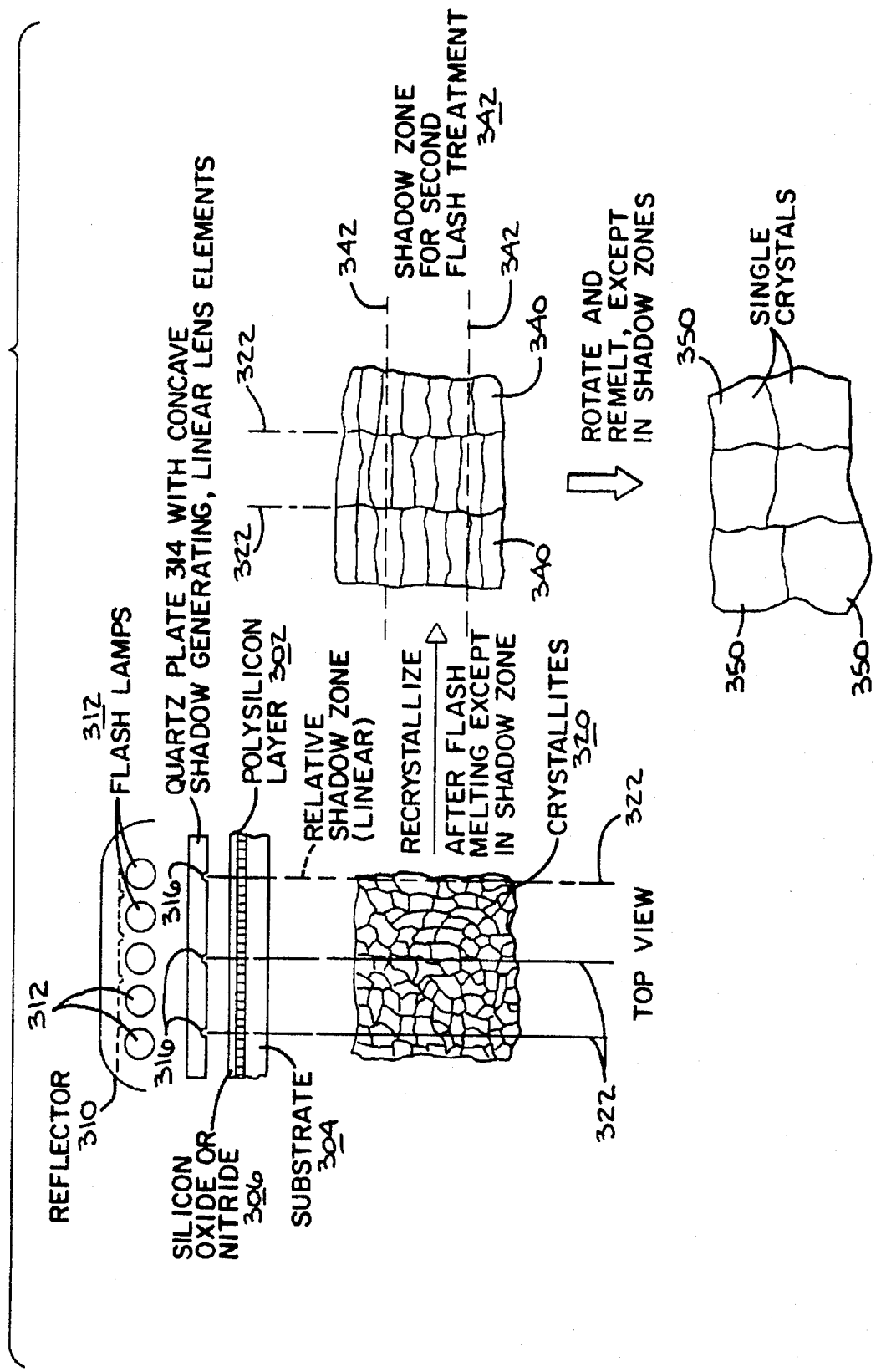
FIG. 3 is a semi-schematic process illustration of an embodiment of unseeded SOI manufacture in accordance with the present invention.
Figure 4:
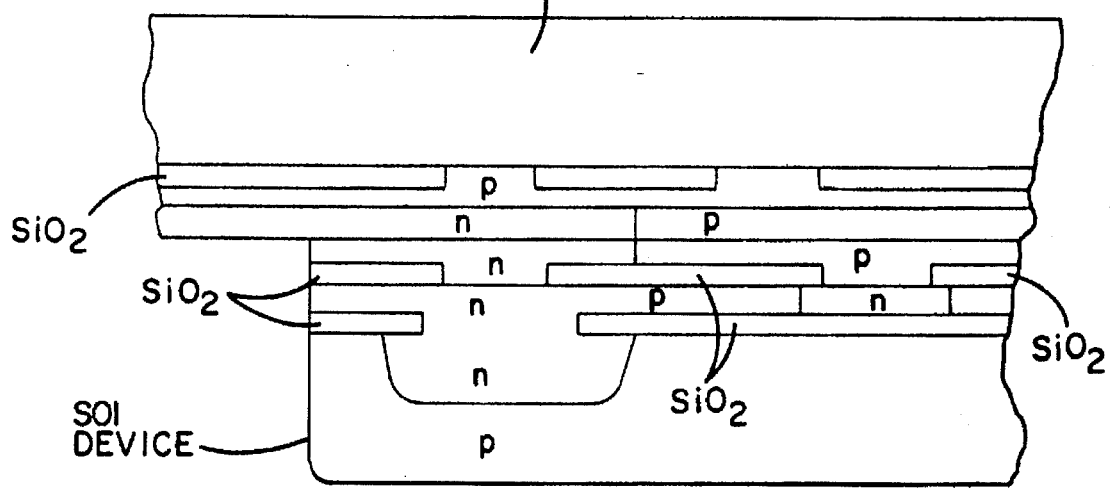
FIG. 4 is a cross sectional view of a semiconductor device in accordance with the present invention which has been bonded to a monocrystalline carrier.
Figure 5:
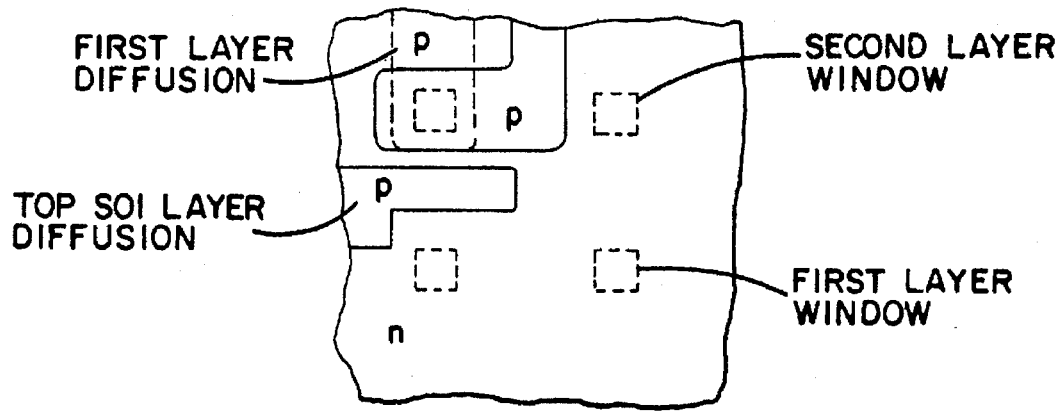
FIG. 5 is a top view of a multilayer SOI device showing inter-SOI layer connection.

As also disclosed, the present methods may be utilized to produce large surface area semiconductor systems having large monocrystalline regions without "seeding" of the recrystallization zone. Substantial research has also been conducted to develop inexpensive methods for large scale manufacture of solar cells. Pulsed light might also be useful to inexpensively provide relatively large crystal polysilicon structures for solar cell use. The polysilicon or amorphous silicon layer might be deposited directly on a suitable dielectric substrate (e.g., quartz glass), with an appropriate capping layer (e.g., silica or silicon nitride). A patterned light pulse, such as produced by suitable focusing elements, or by interposition of a shadowing grid, may be applied to the polysilicon to recrystallize it with a larger grain size than the as-deposited grain size. This step may be repeated using an offset, or rotated pattern to further increase the grain size. In this regard, as shown in FIG. 3, an amorphous or polycrystalline layer 302 of a semiconductor such as doped or undoped silicon, is provided on a suitable substrate 304 such as optically polished, substantially pure fused quartz. A dielectric layer 306 such as a diamond-like carbon, $SiO_2$ or $Si_3N_4$ layer may be formed (e.g., grown or deposited) on the layer 302 in accordance with conventional techniques. A high intensity pulsed flashlamp assembly comprising a reflector 310, flashlamp 312 and associated circuitry (not shown) is disposed adjacent the outer surface of the layer 302.

A flashlamp assembly provides light pulses which are substantially uniform in energy, as previously discussed. Between the flashlamp assembly at a position immediately adjacent the dielectric surface 306 is a quartz plate 314 which is optically flat on its surface adjacent the lamp assembly. At its surface, adjacent the dielectric 306, a plurality of spaced apart, parallel, linear concave lens elements or grooves 316 are provided in the quartz plate. The grooves may be spaced apart a suitable distance, such as in the range of from about 100 to about 500 microns and may be of a suitable width such as from about 2 to about 20 microns and may be provided, for example, by photomasked etching techniques. The purpose of the concave shadow generating elements 316 is to provide linear, relative shadow zones on the polysilicon layer 302 when a light pulse is applied from the flashlamp assembly through the thin quartz plate 314 to the polysilicon layer 302.

A top view of the polysilicon, showing a large number of crystallites 320, in registration with the linear lens element 316 of the quartz plate is shown below the cross sectional view thereof in FIG. 3 (as labeled). Upon applying an intense light flash having sufficient energy to melt the crystallites 320 of the polysilicon layer 302, except in the shadow zones 322, provided by the lens elements 316, the silicon coated substrate will recrystallize from the shadow zones 322 into larger crystallites 340, as also shown in FIG. 3. By subsequently rotating the silicon coated substrate composite under the quartz plate 314 so that the newly oriented shadow zones 342 have a new alignment, again applying an intense light pulse to remelt the composite, substantially larger single crystals 350 may be provided upon recrystallization, as also shown in the FIGURE. A shadow-generating system having a different pattern may also be used for the repeated crystallization steps. The recrystallization plate may be carried out at a desired, elevated substrate temperature, e.g., 500°–1200° C. in order to control the recrystallization rate.

Multiple SOI layers, each layer having integrated circuit devices formed therein, may be fabricated by repeated application of the above-described steps. The surfaces may be polished to optical flatness, provided with surface silanol groups, pressed together with another similar surface and bonded thereto at elevated temperature to form a carrier/device assembly which may provided for improved device connection. Moreover, other semiconductor materials such as gallium arsenide and other III–V compounds and II–VI compounds may be applied to similar or different substrates, such as sapphire. Similarly, conductors such as nickel or a chromium disilicide may be formed in monocrystalline layers over a silicon substrate by using these methods.

In this regard, the present invention is also particularly directed to methods for manufacturing large wafer substrates (such as silicon or sapphire) having a high quality monocrystalline III–V or II–VI compound such as a GaAs surface layer over an intermediate dielectric layer. The methods provide inexpensive high speed manufacture of large GaAs wafers, which are suitable for fabrication of III–V microwave integrated circuits, high speed digital processors, and other integrated circuitry and opto-electronic devices.

The present methods combine a variety of novel techniques to crystallize GaAs over a dielectric layer atop a monocrystalline silicon wafer. These techniques include:

The step of forming a non-planar (100) silicon wafer substrate having mesa projections or depressions. The wafer crystalline orientation may be slightly tilted (e.g., at about 6) to suppress epitaxial GaAs growth dislocations.

Further in accordance with such methods, a transparent high melting temperature dielectric surface may be formed over the silicon wafer except at epitaxial growth windows at the mesa area. The epitaxial "seed" windows are thus formed at an elevation different from the main silicon surface. A polycrystalline or amorphous GaAs layer is subsequently applied to the windowed substrate. The GaAs layer may include conventional dopants to render the GaAs non-conductive if desired. A transparent high melting temperature dielectric encapsulating layer is applied atop the GaAs layer, to prevent loss of arsenic and to maintain the shape of the GaAs layer during subsequent flash thermal processing and recrystallization. A high intensity, uniform light pulse may be applied to substantially instantaneously melt the GaAs, without melting the silicon wafer substrate or the encapsulating dielectric layers.

The GaAs is subsequently tortuously crystallized along different crystal growth faces from the "seed" windows to remove crystal defects and provide broad, planar monocrystalline GaAs zones. The surface dielectric may be removed to provide GaAs monocrystalline islands insulated from a monocrystalline silicon wafer, which may be used in device manufacture.

The process will now be more specifically described with respect to the embodiment illustrated in FIGS. 6–12.

Figure 6:
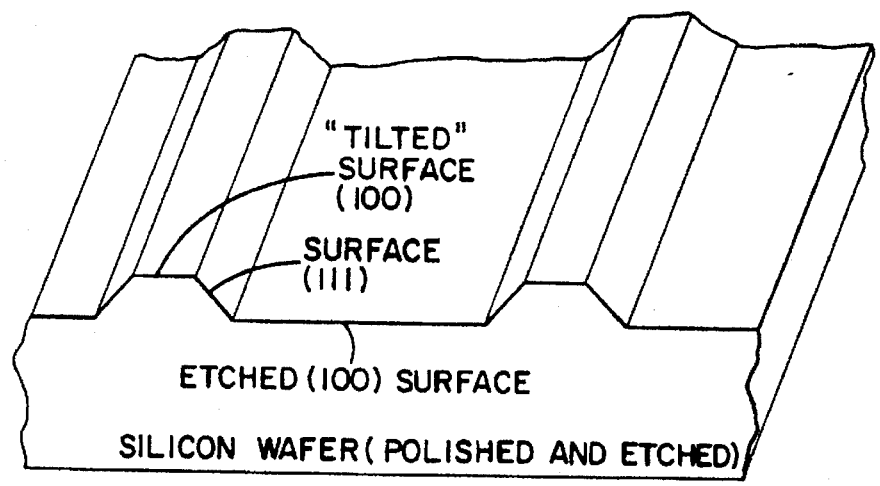
FIG. 6 is a perspective, cross-sectional view of a silicon wafer prior to application of insulating and GaAs layers.

As shown in FIG. 6, a polished Si wafer which has been cut at an acute angle (e.g., 6° to reduce misfit defects) to the (100) face is appropriately masked and anisotropically etched to produce a series of parallel mesas with (111) sides. The mesas will be used to form "seed" windows, and intermediate planar valleys where GaAs will be crystallized.

Figure 7:
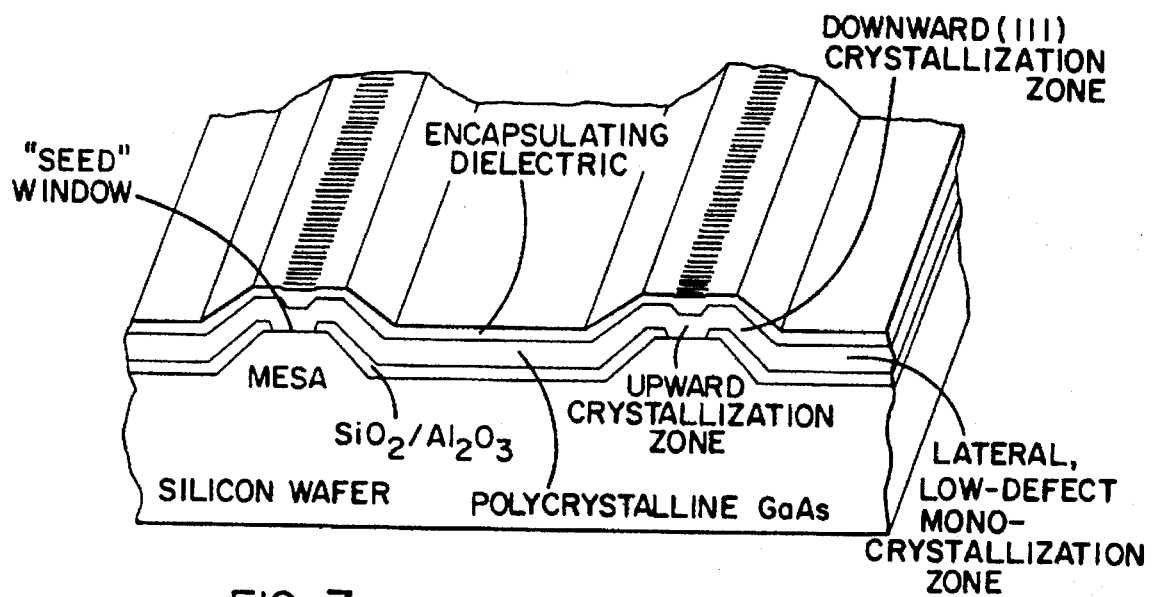
FIG. 7 is a perspective view of the substrate of FIG. 6, to which has been applied a dielectric layer and III-IV compound layer, followed by a cappaing layer.

As shown in FIG. 7, a thermal silicon oxide layer (e.g., in the range of from about 0.5 to about 2 microns thick) may be grown atop the silicon wafer. It may be desirable to deposit a relatively more inert layer, such as an Al2O3 (amorphous) or diamond-like carbon or other inert layer atop the SiO 2 layer for contact with the GaAs during recrystallization. Aluminum oxide has a coefficient of thermal expansion which exceeds that of silicon, and accordingly may assist in creating greater thermal stability and less mechanical strain in the III–V layer upon cooling. Linear windows are etched through the oxide atop the mesas to expose monocrystalline silicon epitaxial growth windows.

Polycrystalline or amorphous GaAs may be rapidly and economically deposited on the wafer to a predetermined thickness such as from about 1 to about 15 microns. The windows may be in the range of from about 1 to about 15 microns wide, and may be in the form of an array separated by from about 25 to about 80 micron distance in a (100) orientation along their length. A protective dielectric encapsulation layer may be provided over the amorphous or polycrystalline GaAs layer to maintain the shape of the GaAs layer after it is melted, and during recrystallization. Furthermore, by encapsulating the GaAs layer prior to optically pulse-melting the GaAs, the dimensional stability, surface texture and planarity of the discrete areas may be controlled. The encapsulating layer further prevents evaporation of As.

A spatially uniform intense light pulse, which may be a high power incoherent Xenon flashlamp pulse is applied to substantially instantaneously melt the amorphous or polycrystalline GaAs layer. A small portion of the monocrystalline silicon substrate may also be melted through the windows. However, because GaAs has a lower melting point than silicon, sufficient power may be applied by optical pulse to melt the GaAs without melting the silicon at the seed windows. The amount of power will depend on the substrate temperature, the GaAs thickness and the environment (furnace) temperature. The flashlamp array may typically have a spectral emission characteristic similar to black body radiation at a temperature in the range of from about, say 7,000K. to about 9,500K., and provides readily absorbed energy for melting of the GaAs layer. High power flash lamps may be provided in accordance with conventional practice, with particular attention to the design of light distribution or reflection systems which produce a substantially uniform energy distribution at the surface to be treated.

By applying one or more intense flashes of incoherent light over the entire wafer, in a time which is small (e.g., in the range of from about one nanosecond to about 10 milliseconds, such as from about 0.1 to about 5 milliseconds) in respect to thermal conduction through an insulator layer, of sufficient intensity to melt an amorphous or polycrystalline GaAs layer deposited over an Si wafer separated from the GaAs except at seed windows, it is proposed that precise recrystallization control may be obtained. The silicon wafer "seed" is slightly tilted to improve epitaxial recrystallization. The windows will be located at a different elevation from the main recrystallization areas so that tortuous recrystallization from different crystal faces will eliminate defects.

The high thermal conductivity of molten GaAs, together with the relatively low thermal conductivity of the silicon dioxide layer, will provide a relatively uniform initial temperature to the molten GaAs produced by the light pulse. However, at the crystallization window, direct conduction to the bulk silicon will more rapidly reduce the temperature of the molten GaAs layer to a crystallization temperature. Heat conduction from the monocrystalline zone will continue propagation of the monocrystalline layer.

One or more subsequent light pulses which are respectively insufficient in energy to melt the GaAs layer, may be applied to maintain the appropriate monocrystallization fronts from the seed regions.

Figure 9:
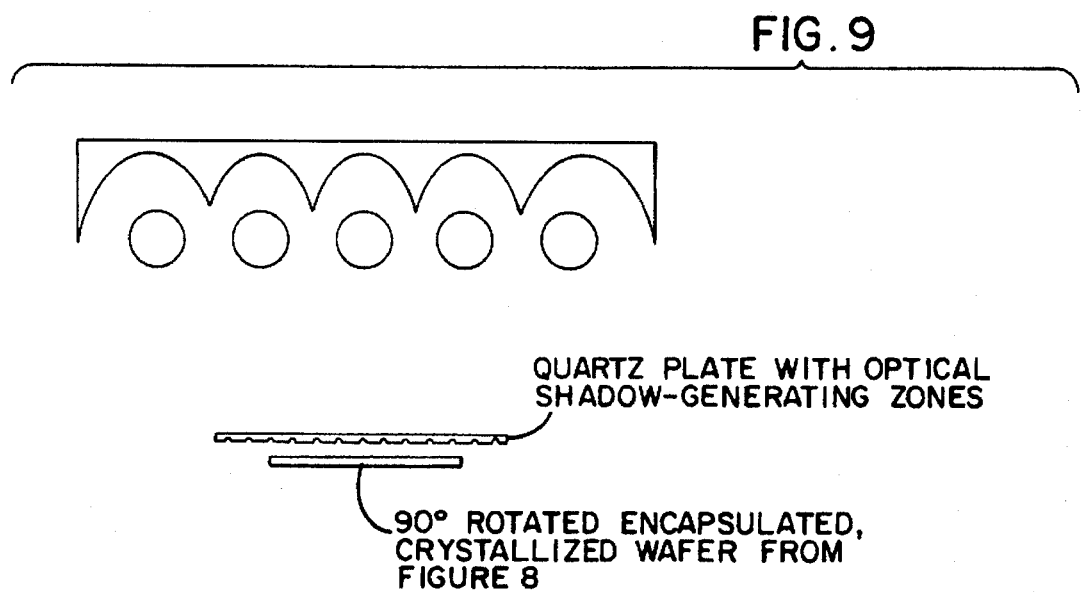
FIG. 9 is an illustration of the composite wafer of FIG. 8 positioned for patterned light treatment.
Figure 10:
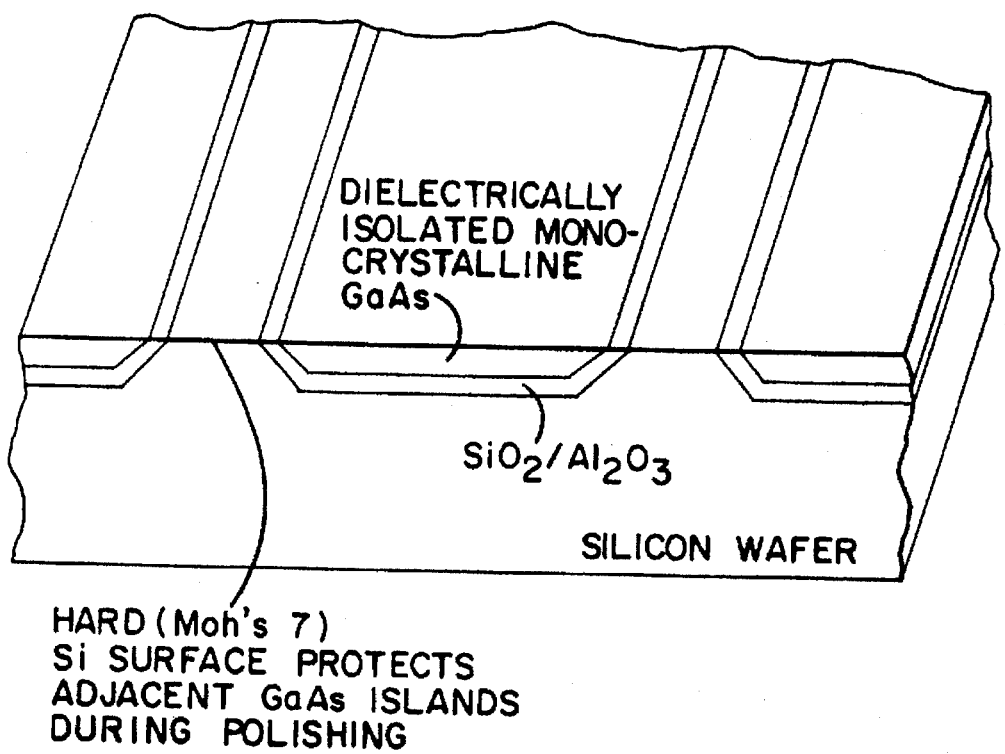
FIG. 10 is a cross-sectional view of the composite wafer of FIG. 8 after polishing or patterned etching.

As shown in FIG. 9, a patterned light pulse, such as produced by suitable focusing elements, or by interposition of a shadowing grid, may optionally be applied to the once-recrystallized GaAs in a direction orthogonal to the seed windows to recrystallize the GaAs with larger defect-free zones than those produced by the first tortuous crystallization. A quartz plate optical element may b e positioned between the flashlamp assembly and the Si-GaAs wafer. The quartz plate is optically flat on its surface adjacent the lamp assembly. At its surface, adjacent the dielectric, a plurality of spaced apart, parallel, linear concave lens elements or grooves are provided in the quartz plate. The grooves may be spaced apart a suitable distance, such as in the range of from about 50 to about 500 microns and may be of a suitable width such as from about 2 to about 20 microns. The purpose of the concave shadow generating elements is to provide linear, relative shadow zones on the recrystallized GaAs when a light pulse is applied from the flashlamp assembly through the thin quartz plate, such that the GaAs in the shadow zones is not melted by the light pulse.

By placing the GaAs silicon wafer composite under the quartz plate so that the newly oriented shadow zones are perpendicular to the seed-window mesas, higher quality GaAs zones may be provided upon recrystallization.

Desirably, the light pulse application will be carried out in an inert atmosphere, such as an argon atmosphere, or in an arsenic-rich atmosphere if arsenic loss is present. During flash optical processing, the silicon wafer substrate will be maintained at an elevated temperature below the melting point of silicon and below the melting point of GaAs (e.g., a temperature in the range of 900°–1300°C.) such that cooling of the melted GaAs layer will be at a rate appropriate to tortuous monocrystallization from the window zones. In this regard as shown in FIG. 7, the initial crystallization front is upward from the seed window, then across the top of the mesa. Many crystal discolorations and imperfections will grow into the top of the encapsulation layer. Growth is subsequently forced downward along the (111) plane, and then along the valley plane. With each change of direction, imperfections will grow into the surrounding walls, and be removed. Subsequent to crystallization, the encapsulating surface layer is removed so that conventional processing steps may be implemented to form active devices on the array of single crystal islands. The upper encapsulating dielectric layer may be removed and the recrystallized layer may be etched, polished and processed to produce integrated circuits in accordance with conventional procedures. In this regard, the silicon mesa areas will "protect" the fragile GaAs during polishing because of the relatively high hardness and strength of silicon.

The polished GaAs wafer surface may subsequently have one or more epitaxial layers of GaAs of different conductivity type deposited thereon in accordance with conventional procedures. When the recrystallized GaAs islands are of insulating GaAs, a very low capacitance structure should be produced. Imperfections are located at zones intermediate the "windows" and may be easily avoided in circuit design.

Such GaAs composite structures may be utilized to provide latch-up free integrated circuits, particularly integrated digital memory and microprocessor circuits and integrated analog circuitry, which should have low sensitivity to ion radiation, good mechanical strength and high packing density. Such composites may also be used in the manufacture of circuits such as charge coupled devices which would benefit from low capacitance effects, and in lasers on large-scale optical systems.

Smooth transparent carbon films may be deposited onto room temperature silicon or sapphire wafers in an appropriate manner such as in a dc plasma of a hydrocarbon methane ($CH_4$) which may include an oxygenated hydrocarbon component such as low molecular weight alcohols or ketone, and hydrogen ($H_2$) [See, Properties of Carbon Films by dc Plasma Deposition, Kazutaka, F., et al., Appl. Phys. Lett. 47 (4) Aug. 15, 1985]. The films may desirably consist primarily of amorphous carbon (a–c). Diamondlike carbon films having desirable properties such as high electrical resistivity, hardness, chemical inertness and optical transparency may be deposited by various methods such as rf [L. Holland, et al., Thin Solid Films 58, 107 (1979); H. Vora, et al., J. Appl. Phys. 52, 6151 (1981); S. Berg, et al., Thin Solid Films, 58, 117 (1979)] and dc [D. S. Whitmell, Thin Solid Films, 35, 255 (1976] plasma deposition, ion beam deposition [H. Vora, et al., supra; S. Aisenberg, J. Appl. Phys., 42, 2953 (1971); E. G. Spencer, et al., Appl. Phys. Lett. 29, 118, (1976); T. J. Moravec, et al. J. Vac. Sci. Technol., 18, 226 (1981)], chemical vapor deposition [S. Matsumoto, et al., Jpn. J. Appl. Phys., 21, L183 1982); B. V. Spitsyn, et al., J. Cryst. Growth, 52, 219 (1981)] and sputtering [J. J. Hauser, et al., Solids, 23, 21 (1977); S. Craig, et al., Thin Solid Films, 997, 345 (1982); A. Hiraki, et al., Solid State Commun., 50, 713 (1984)].

Figure 13:
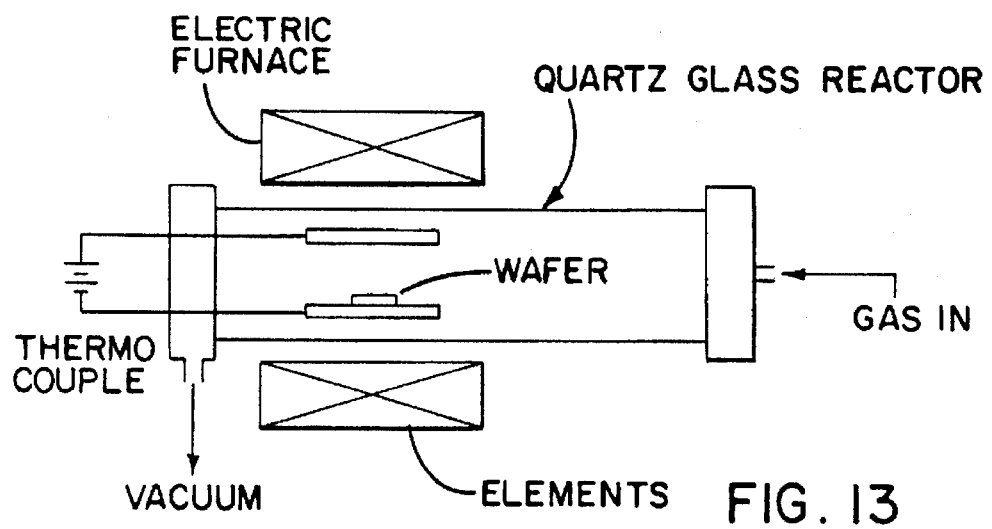
FIG. 13 is an illustration of carbon deposition apparatus.

Carbon films with diamondlike properties may be deposited onto room-temperature silicon substrates by the plasma deposition of $CH_4$ and $H_2$ by means of dc glow discharge apparatus shown in FIG. 13. A gas flow system is utilized in order to ensure reproducibility of the gas mixtures in the quartz glass reactor. The reactor may be pre-evacuated by rotary pump to below 1 Pa and backfilled with $CH^4$ (99.95% purity) and $H^2$ (purified hydrogen); mass flow controllers are used to regulate the constant gas flow rates. The total pressure of the system is kept constant at a predetermined pressure by means of an automatic throttle valve connected to an absolute pressure gauge.

The silicon substrate is placed on a negatively biased platinum cathode. A tungsten plate, placed 2 cm from the substrate and grounded to earth, serves as the anode. An electric furnace may be used to heat the substrate when such heating is desired, with the temperature being monitored by a thermocouple. Substrate temperature, in the range of room temperature −200° C., gas mixture ratio ($CH_4/H_2$), 0.01–100% $CH_4$; pressure, 67 Pa; period, 30 minutes; current density, 0.125–2.5 mA/cm$^2$ may be used to deposit the amorphous carbon film.

Bond lengths of a–c deposited under constant pressures of 67 Pa may be varied as a function of discharge current density. At low discharge current densities or low pressures, the bond length of a–C may be almost identical with that of diamond (1.54 Å). Variations in bond length and/or refractive index of the deposited carbon may be varied by variation of deposition conditions and by incorporation of very small quantities of non-carbon atoms, such as silicon, boron, hydrogen, oxygen and fluorine in the deposited carbon. For example, the refractive index may be increased by incorporation of silicon atoms into the carbon film. Dangling bonds in the amorphous structures may be compensated by hydrogen, or preferably, fluorine. Electrical resistivity may be in excess of $2.8 \times 10^{13}$ ohm-centimeter.

Transparent carbon films with a high degree of surface smoothness may be deposited on silicon wafers at room temperature by cracking a mixture of $CH^4$ and $H^2$ in dc glow discharge, and by periodically introducing appropriate amounts of other components, such as silicon with due care to prevent graphite formation, as the carbon film is deposited, layers suitable for optical devices such as waveguides and bandpass filters may be fabricated. Such components may be introduced as vapor-phase precursors such as silanes, and perfluorinated hydrocarbons (e.g., hexafluoroethane), xenon difluoride, boranes, amines, etc., and some components may be introduced by sputtering (by separate electrode system) a substrate, such as silicon substrate, containing the desired atoms. Typically, less than 1 percent by weight of the non-carbon maerial is utilized. Fluorine is a particularly desirable component because it can disrupt graphite formation, and forms a stable bond with the carbon.

Figure 11:
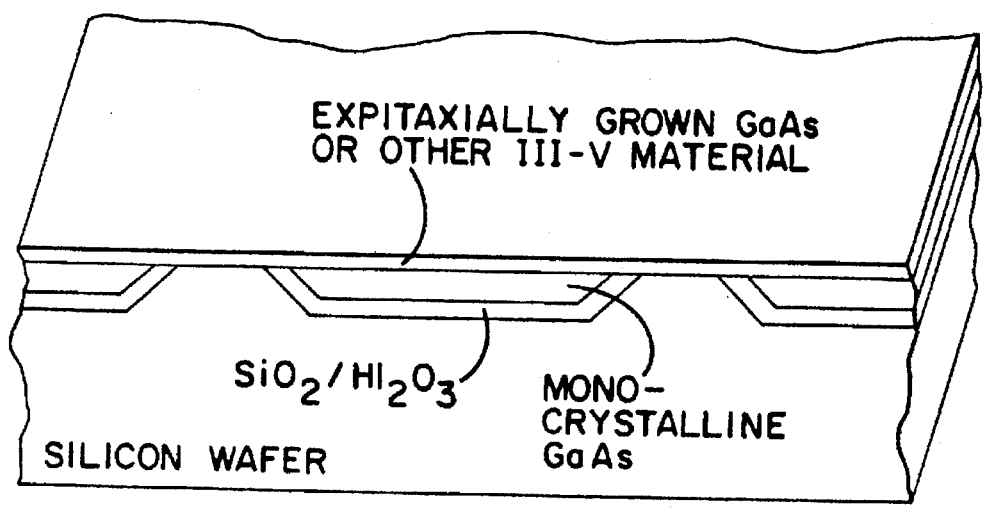
FIG. 11 is an illustration of the composite wafer of FIG. 10 after epitaxial III-IV compound deposition.
Figure 12:
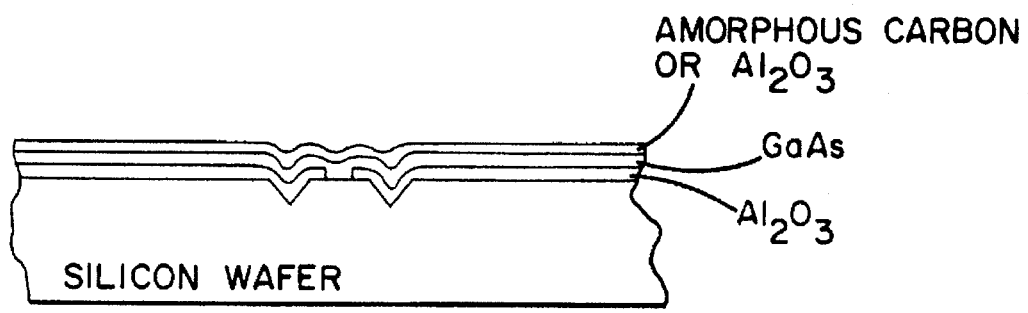
FIG. 12 is an illustration of an alternative substrate configuration for III-IV compound tortuous crystal growth.
Figure 14:
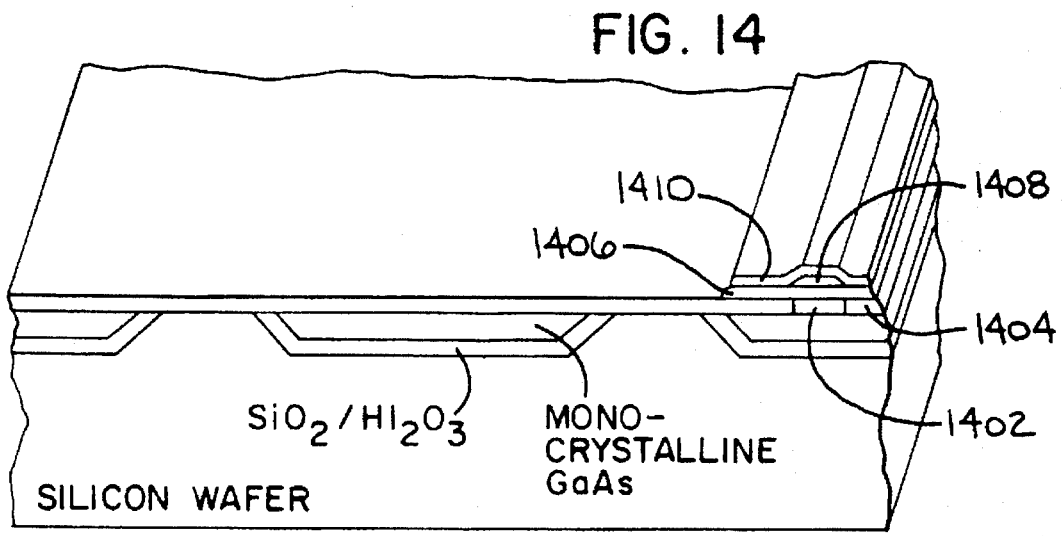
FIG. 14 is a cross-sectional view of an amorphous carbon waveguide atop a GaAs/silicon wafer.

In this regard, illustrated in FIG. 14 is a wafer such as shown in FIG. 11, in which a heterojunction laser schematically illustrated at 1402 is fabricated in the monocrystalline GaAs zone 1404. By depositing an amorphous carbon layer 1406, shown partially broken away, having a low index of refraction (e.g., 2 to 4 microns thick carbon, with relatively high hydrogen, oxygen and/or fluorine content) followed by a 0.5 to 2 micron thick layer of high refractive index carbon (e.g., containing silicon component) 1408, a composite sheet is provided which may be etched by masking and plasma etching (e.g., with oxygen and/or fluorine active species) to provide a desired waveguide pattern. By depositing a subsequent low index layer of carbon 1410, or other dielectric over the waveguide pattern, a carbon waveguide for optical device interconnection may be produced. Similarly, by alternating layers of high and low index carbon, reflective and transmission optics of predetermined reflectivity and bandpass, respectively, may be fabricated.

Elemental carbon may occur naturally or be fabricated in a variety of physical forms. In this regard, graphite (which is soft and relatively weak), in which the carbon is present as planar sheets of trigonally bonded carbon, is the thermodynamically stable form under standard conditions of temperature and pressure. Diamond (which is exceptionally hard), in which carbon is tetrahedonally bonded, is the stable form at very high temperature and pressure. A number of intermediate carbon forms at least partially based on acetylenic bonds and known as "carbynes". Some carbyne forms are relatively soft, while others are superhard (harder than cubic boron nitride, which is generally considered to be the hardest known material other than diamond) [Carbon: A New View of its High-Temperature Behavior; Science, p. 673 (May, 1978); Carbynes in Meoeorites: Detection, Low-Temperature Origin, and Implications for Interstellar Molecules; Science, p. 1515 (September, 1980); Carbyne as a Possible Constituent of the Interstellar Dust; Carbynes: Carriers of Primordial Noble Gases in Meteorites; Science, p. 1515 (September, 1980); The P, T Phase and Reaction Diagram for Elemental Carbon, 1979; Liquid Carbon in the Lower Mantle?, Geology, p. 219 (April, 1983); Shock Compression of Diamond Crystal,].

Laser heating experiments have demonstrated the formation of carbynes in the temperature range of 2600 to 3800 Kelvin, with the production of a transparent carbon liquid at 3800 Kelvin, which retained its carbyne form when droplets were rapidly quenched at a rate of 30,000K/second. Carbon my also be fabricated as vitreous carbon, which has a relatively low density and turbostatic structure, by controlled pyrolysis of suitable precursors [polymeric Carbons, Carbon Fibre, Glass and Char, by G. M. Jenkins & K. Kawamura].

Figure 8:
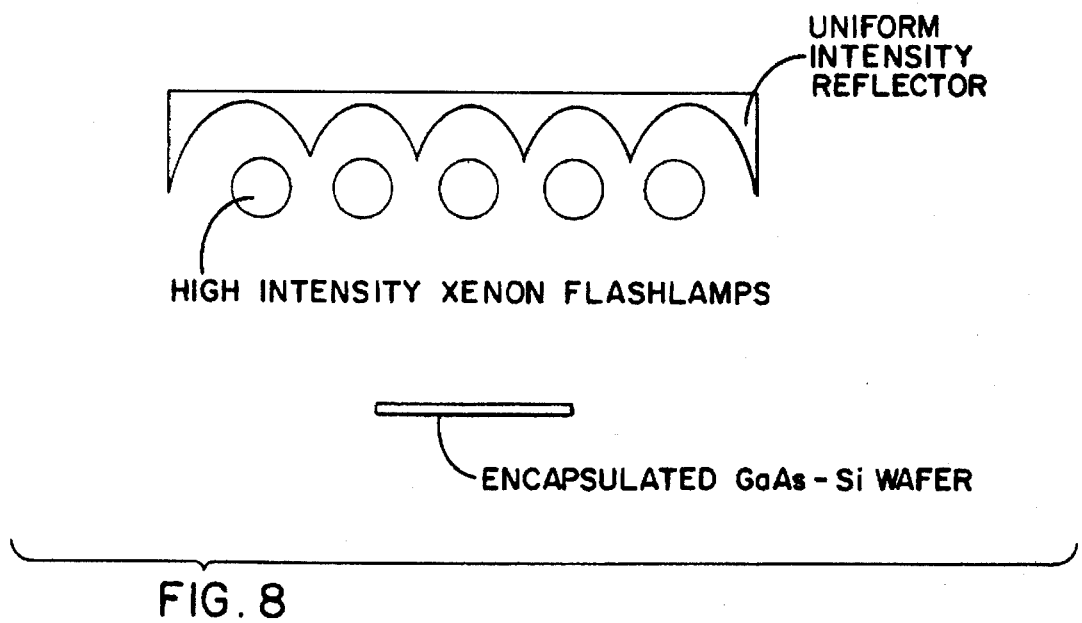
FIG. 8 is an illustration of the composite wafer of FIG. 7 positioned for high energy pulsed light processing in a treatment chamber.

Also in accordance with the present invention, a carbon substrate, which preferably is highly polished, may be subjected to an effective pulse of coherent or incoherent light of sufficiently short duration (e.g., 0.1 microsecond to 100 milliseconds, preferably less than 0.1 millisecond) such as shown in FIG. 8, which is small in respect to the heat conduction rate away from the surface, and of sufficient intensity (e.g., in the range of from about 10 to about 50 joules per square centimeter) that the surface layer is substantially instantaneously heated to a temperature above about 2600K. to convert the surface layer to a dense carbyne form. Following the pulse, the surface layer is rapidly cooled by conduction to the adjacent carbon substrate and/or a relatively cooler, inert gas such as flowing hydrogen or argon at ambient temperature or below (e.g., –20° C.) to provide a hard carbyne surface. Short, high intensity pulses may be provided by pulsed flash lamps (e.g., Xenon flashlamp) with reflective convergent optics to concentrate the flashlamp output. Desirably, the light intensity is uniform on the substrate surface. Such flashlamps are manufactured by EG&G. Desirably, at least about 20% of the energy of the light pulse will be in the UV range, which has a short absorption length.

The carbon substrate should best be substantially completely pure. It may be of graphitic, pyrolytic and/or vitreous carbon, and may be self-supporting, or a thin layer or fiber deposited on another material. The carbon substrate is best maintained at room temperature or below prior to applying the intense light pulse, in order to provide for a high cooling rate to the internal portions of the substrate during and following the application of the pulse. However, the carbon should also be heated under vacuum (e.g., less than $5 \times 10^5$ Torr) at an elevated temperature (e.g., at least 1000° C.) to remove volatile or reactive surface or internal gases or other materials which might disrupt the surface upon intense heating of the surface.

The process may best be carried out in a vacuum in a stable region for the carbyne form of carbon (e.g., greater than about $2 \times 10^4$ Pa at 3800K) and/or in the presence of an inert gas. If the carbon has entrapped gaseous components (e.g., hydrogen) which could cause surface disruption upon rapid heating, it may be desirable to apply the light energy heating pulse to the carbon surface under high pressure of inert gas, such as about 5 atmospheres or more of an inert gas such as argon.

The surface of the carbon being treated may be subjected to a hydrogen ion, inert gas ion (e.g., argon), and/or oxygen ion bombardment at the time the surface is substantially instantaneously heated, and the surface may be maintained in a magnetic field of greater than 500 gauss while the substantially instantaneously heated carbon is cooled.

By treating a polished surface of a substrate such as a vitreous carbon substrate having a hardness of about 7 Mohs, a superhard, polished very thin surface layer may be provided which may require little, if any, subsequent polishing for integrated circuit substrate use. By subsequently grinding and polishing an acute surface to the superhard layer (e.g., at 45), a superhard knife edge, useful for example, as a microtome, or a surgical knife, may be provided.

By application of pure carbon upon a superhard carbyne layer, and subsequent pulsed light treatment as previously described, the layer thickness may be increased, or a layered composite structure having desirable physical properties may be provided. If the carbon layer which is deposited (e.g., by conventional rf sputtering or vapor deposition techniques) is thinner than the surface layer heated by the light pulse to the carbyne conversion temperature, a continuous carbyne layer may be built up by repeated carbon deposition and light pulse treatments. If the deposited carbon layer is thicker than the zone converted to carbyne, a layered structure is prepared. These thicknesses may be adjusted by adjusting parameters including flashlamp intensity, flashlamp spectrum distribution, and carbon deposit thickness. Zones of other materials, such as carbides or other high performance inorganics (e.g., carbon fibers) may be included in such composite structures. Large areas may be treated to form a unitary, hard surface (e.g., greater than 10 square centimeters). In addition to substrates for integrated circuits, the processing may be used to produce medical implant devices such as heart valves and joint prostheses with superhard wear surfaces, machine bearings such as automobile engine, transmission and wheel bearings, armour and space vehicle composites.

Figure 15:
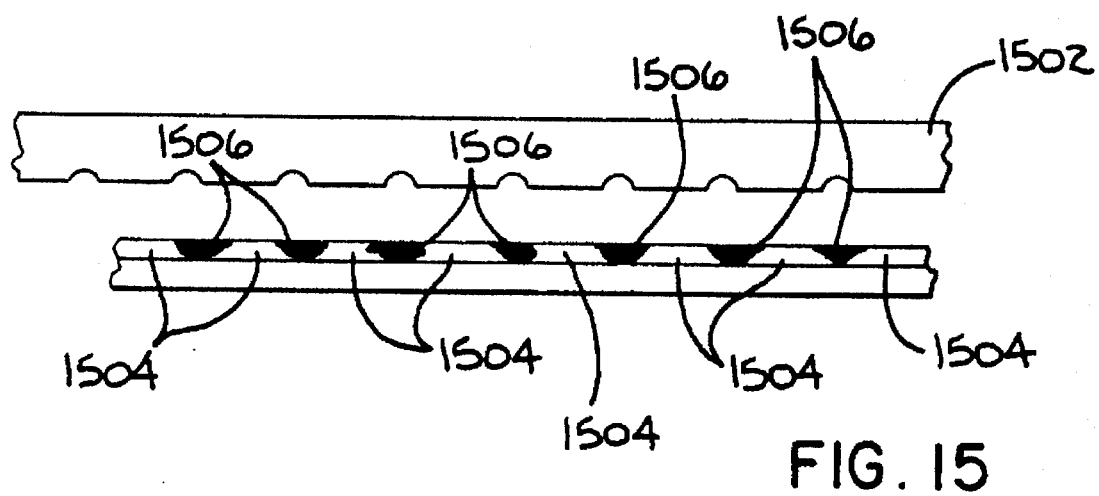
FIG. 15 is a cross-sectional side view of a quartz optical element lens for providing a controlled, micro-distributed optical energy distribution to a polycrystalline layer on the backside of a semiconductor wafer for backside gettering.
Figure 16:
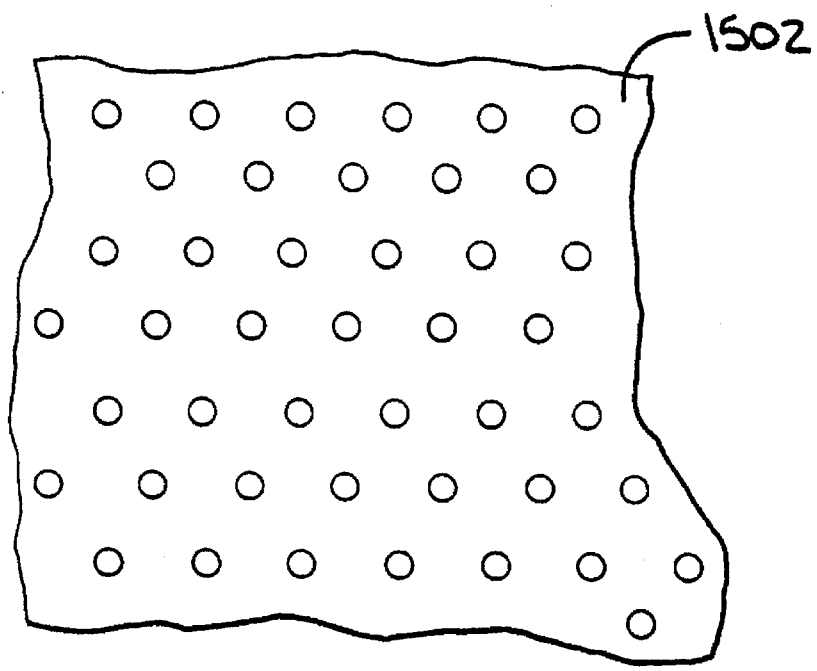
FIG. 16 is a bottom view of a portion of the lens element of FIG. 15.

Gettering of impurities in a silicon wafer may be accomplished by depositing amorphous or polysilicon layer (e.g., 0.5 to 10 microns thick) on the backside of a silicon wafer, and pulsing light as previously described in a closely spaced pattern to epitaxially melt and recrystallize areas 1504 and leave polycrystalline areas 1506 for entrapping impurities, as shown in FIG. 15.

While the treatment of carbon is particularly attractive, other materials such as hard carbides (Boron, tungsten, titanium, etc.) may be pulse-treated to provide hard and/or glassy surfaces, which may be utilized as integrated circuit substrates, etc.

While the present invention has been particularly described with respect to a particular embodiment described herein, it will be appreciated that various modifications and adaptations may be made based on the present disclosure and which are intended to be within the spirit and scope of the present invention as set forth in the following claims.

What is claimed is:

1. An integrated optical circuit device having a diamond-like carbon optical waveguide structure, comprising a substrate, a first diamond-like carbon layer atop the substrate and having a first refractive index, a diamond-like carbon optical waveguide core atop the first layer having a second refractive index greater than the first refractive index of the first layer, and a cladding layer of diamond-like carbon atop the first layer and the waveguide core having a third refractive index lower than the waveguide core.

* * * * *